United States Patent [19]

King et al.

[11] 4,142,925
[45] Mar. 6, 1979

[54] METHOD OF MAKING SILICON-INSULATOR-POLYSILICON INFRARED IMAGE DEVICE UTILIZING EPITAXIAL DEPOSITION AND SELECTIVE ETCHING

[75] Inventors: Gerard J. King, Alexandria; Joseph F. Martino, Jr., Falls Church, both of Va.

[73] Assignee: The United States of America as represented by the Secretary of the Army, Washington, D.C.

[21] Appl. No.: 896,069

[22] Filed: Apr. 13, 1978

[51] Int. Cl.² .................. H01L 21/20; H01L 27/14
[52] U.S. Cl. ..................................... 148/175; 29/571; 29/572; 148/1.5; 156/657; 156/659; 156/662; 250/332; 250/370; 357/24; 357/30; 357/45; 357/49; 357/56
[58] Field of Search .................. 148/1.5, 175, 187; 156/657, 659, 662; 29/571, 572, 578, 580; 250/332, 370; 357/24, 30, 45, 49, 56

[56] References Cited

U.S. PATENT DOCUMENTS

| 3,423,651 | 1/1969 | Legat et al. ................. 29/580 X |
| 3,806,729 | 4/1974 | Caywood ..................... 250/370 X |
| 3,829,889 | 8/1974 | Allison et al. .................. 357/49 |
| 3,849,651 | 11/1974 | Ennulat ........................ 357/24 X |
| 3,883,437 | 5/1975 | Nummedal et al. ........... 357/30 X |
| 4,050,979 | 9/1977 | Smeltzer et al. ............. 156/657 X |
| 4,079,507 | 3/1978 | King et al. ................... 148/175 X |
| 4,093,957 | 6/1978 | King et al. ..................... 357/30 X |

OTHER PUBLICATIONS

Steckl et al., "Theoretical Analysis . . . IRCCD Serial Scanning," Appl. Conf. on Charge Coupled Dev., Proceedings, San Diego, Ca., 1973, pp. 247–258.

Primary Examiner—R. Dean
Assistant Examiner—W. G. Saba
Attorney, Agent, or Firm—Nathan Edelberg; Milton W. Lee; Aubrey J. Dunn

[57] ABSTRACT

A layer of epitaxial silicon is grown on a silicon growth substrate, a thin layer of silicon dioxide or other suitable insulator is grown (in the case of silicon dioxide) or deposited (for other insulators) on the epitaxial layer, and a thick layer of polysilicon is grown on the dioxide layer. The silicon growth substrate is then removed, and the epitaxial layer is etched to form islands on the insulator layer. Some of the islands are doped to form an array of infrared sensitive detectors, and a large island is doped to act as CCD region. Electrical leads are fabricated, some to provide drive and output lines for the CCDs, other to provide connections of the detectors to respective CCDs, and yet others to provide common leads for the detectors.

2 Claims, 2 Drawing Figures

4,142,925

METHOD OF MAKING SILICON-INSULATOR-POLYSILICON INFRARED IMAGE DEVICE UTILIZING EPITAXIAL DEPOSITION AND SELECTIVE ETCHING

The invention described herein may be manufactured, used, and licensed by the U.S. Government for governmental purposes without the payment of any royalties thereon.

BACKGROUND OF THE INVENTION

This invention is in the field of solid-state imaging detectors for infrared. Various types of such detectors have been proposed, but have been difficult to make with good definition, because of a lack of both optical and electrical isolation between elemental detector elements. The instant invention takes advantage of the known (and desirable) silicon-insulator-polysilicon (SIP) on-chip growth technology.

SUMMARY OF THE INVENTION

The invention is a method of making an infrared imaging device. The method uses SIP chip growth technology to form a two-dimensional array of incremental extrinsic detectors. During processing of the chip for the detectors, charge coupled devices (CCDs) are also made on the chip. These CCDs are connected to respective detectors through coupling regions and to readout (drive) lines on the chip.

DETAILED DESCRIPTION OF THE INVENTION

Figure 1:
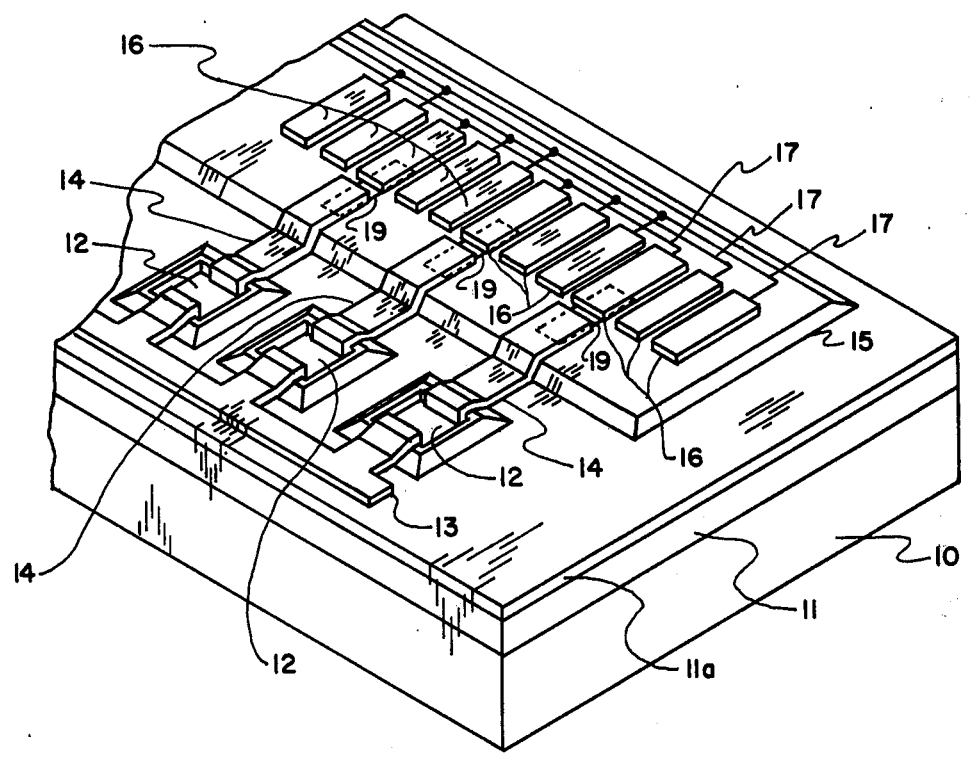
FIG. 1 is a pictoral view of a portion of a device made in accordance with the invention.

The invention may perhaps be best understood by referring to the drawings. FIG. 1 shows layer 10 of polysilicon which acts as a mechanical support of the remainder of the device made in accordance with the invention. Layer 11 is a silicon dioxide layer on layer 10, and layer 11a is a thin thermal oxide layer on layer 11. On layer 11a are doped epi-silicon detectors 12 having electrical connecting leads 13 and 14. As can be seen, lead 13 is common to one side of each of detectors 12. Reference numeral 15 designates an island of silicon doped for CCD's 16 having drive conductors 17. Additionally, coupling regions 19, consisting of electrodes and doped areas, are on island 15. Each of detectors 12 is connected to a respective one of coupling regions 19 by respective leads 14 for readout of the detectors. For conventional three phase CCD readout, three electrodes 17 are associated with each coupling region 19. The three electrodes may be considered a unit cell for the CCD. It should be understood that detectors 12 are in a two-dimensional array, althrough only a portion of one row of the array is shown.

DESCRIPTION OF INVENTIVE METHOD

Figure 2:
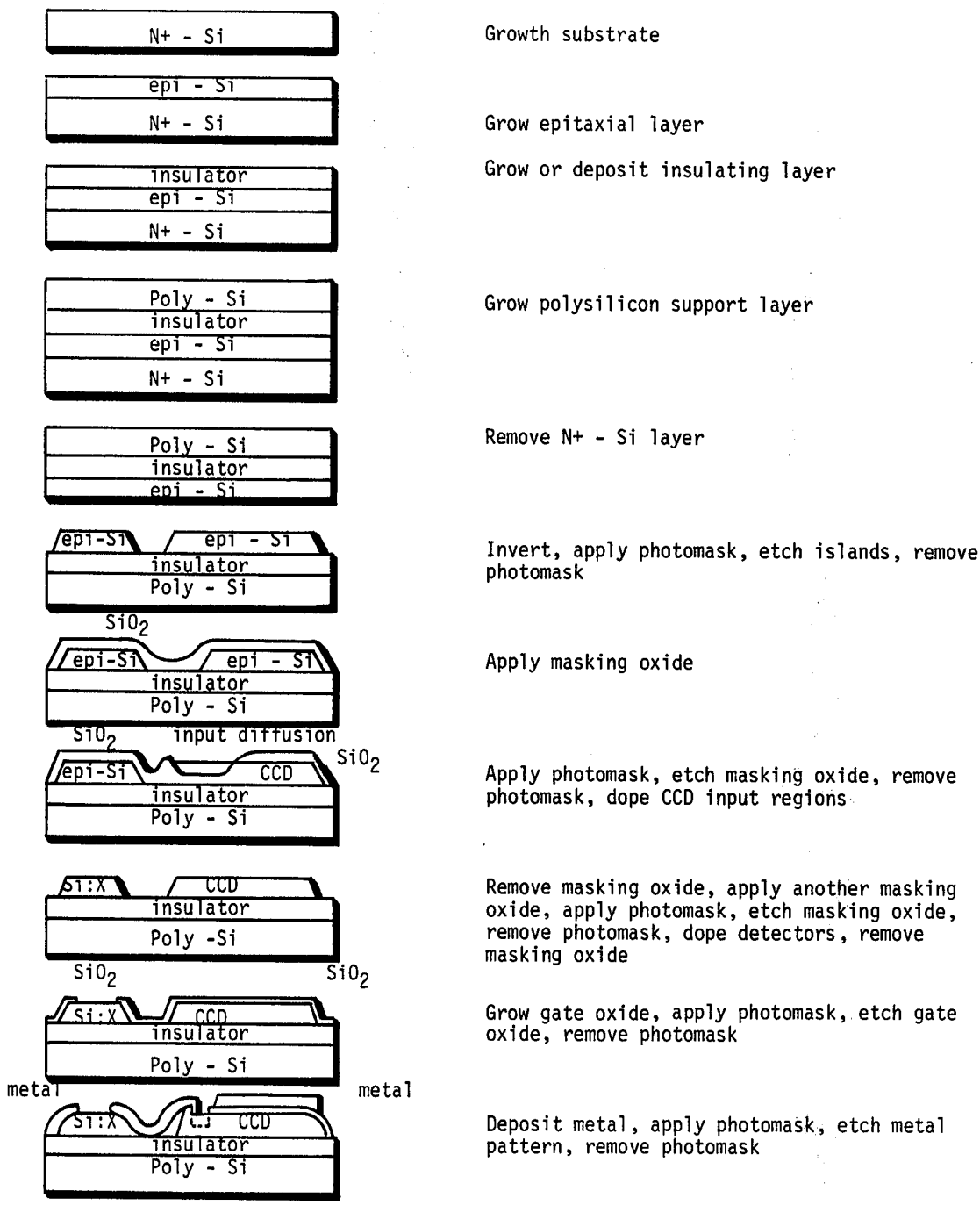
FIG. 2 is a flow chart for the inventive method.

The method whereby the above-described device may be produced begins with a growth substrate of relatively impure N+ silicon, as seen in FIG. 2. We grow a layer of epitaxial silicon atop the growth substrate, a silicon dioxide or other suitable insulating layer on the epitaxial layer, and a polysilicon support layer on the insulator layer. We then remove the N+ silicon growth substrate (as by etching), invert the remaining laminate, and apply a photomask or a silicon dioxide mask. Through openings in the mask we etch away the epitaxial silicon layer to form islands of epitaxial silicon on the underlying insulator layer, some islands to act as detectors, and another as a CCD area. We then strip or etch away the mask and apply a masking oxide. Atop this mask oxide we apply a photomask. Through the photomask we etch away the mask oxide to expose areas on the CCD island. These areas we dope to form part of the CCD input regions. Next we remove the photomask, apply another photomask for the detector islands, and dope the detector islands. We remove the last mentioned photomask and create a gate oxide (thermal oxide) in the usual manner. On this gate oxide we apply another photomask and etch through this photomask to expose the doped areas on the CCD island and to expose areas on the detector islands. We then deposit a metalization layer and pattern this photomask using a final photomask to produce CCD conductors and detector conductors. Finally (and not shown in the drawings), we strip the final mask and cover the etched, metalized side of our laminate with infrared transparent glass or any of the other well-known protective layers.

While a particular method has been described whereby our invention may be made, obviously variations are possible in the method without departing from the spirit and scope of our invention. Specifically, the various photomasks could all be silicon dioxide, and would be stripped by etching. Obviously, any such etching must be carefully monitored, to avoid etching the silicon dioxide layer carrying the epitaxial silicon layer. Moreover, various steps of the method might be interchanged or combined. For example, the detectors and the CCD regions might be doped before the epitaxial silicon is etched into islands. Depending on the nature of the epitaxial silicon used, it may or may not be necessary to lightly dope the entire CCD island. The dopants used to form the CCDs and the detectors are well known in the art and are not themselves critical to the invention. The only requirements are that they are able to make the epitaxial silicon layer form infrared sensitive or CCD regions as desired. If the various dopants are applied after the islands are formed, there need be little worry of migration or diffusion between islands, since the islands lie on a silicon dioxide or other suitable insulator layer. Other suitable layers include aluminum oxide, evaporated silicon dioxide glass, and silicon nitride. The word "doping" as used herein is intended to describe diffusion of dopant into a material layer at elevated temperature. However, well known implantation of dopant by ion bombardment may be used, with appropriate modification of the described method.

We claim:
1. A method of making an infrared imaging device beginning with a silicon growth substrate and including the steps of:
    (a) growing on said substrate a layer of epitaxial silicon;
    (b) growing on said layer of epitaxial silicon an insulating layer;
    (c) growing on said insulating layer a support layer of polysilicon;
    (d) removing said growth substrate;
    (e) applying a first mask to said epitaxial layer and etching to form islands of epitaxial silicon on said silicon dioxide layer;

(f) removing said first mask, applying a second mask, and doping at least one of said islands as a CCD region;

(g) removing said second mask, applying a third mask, and doping others of said islands as infrared sensitive detectors;

(h) removing said third mask, depositing a metallization layer, applying a fourth mask, and patterning conductors on said detectors, said insulating layer; and (i) removing said fourth mask.

2. The method as defined in claim 1 wherein steps (e), (f), and (g) are replaced by:

(e)' applying a first mask and doping at least one portion of said epitaxial silicon layer for a CCD region;

(f)' removing said first mask, applying a second mask, and doping other portions of said epitaxial silicon layer as infrared detector regions;

(g)' removing said second mask, applying a third mask, and etching the doped epitaxial silicon region to form islands of said doped regions on said insulating layer.

* * * * *